(12) United States Patent
Lin et al.

(10) Patent No.: US 9,203,349 B2
(45) Date of Patent: Dec. 1, 2015

(54) ULTRA-WIDEBAND LOW-NOISE AMPLIFIER CIRCUIT WITH LOW POWER CONSUMPTION

(71) Applicant: National Chi Nan University, Puli, Nantou (TW)

(72) Inventors: Yo-Sheng Lin, Nantou (TW); Lun-Ci Liu, Nantou (TW); Chia-Hsing Wu, Nantou (TW)

(73) Assignee: National Chi Nan University, Puli, Nantou (TW)

( * ) Notice: Subject to any disclaimer, the term of this patent is extended or adjusted under 35 U.S.C. 154(b) by 0 days.

(21) Appl. No.: 14/166,919

(22) Filed: Jan. 29, 2014

(65) Prior Publication Data

US 2015/0048889 A1    Feb. 19, 2015

(30) Foreign Application Priority Data

Aug. 15, 2013   (TW) .............................. 102129301 A

(51) Int. Cl.
*H03F 1/22* (2006.01)
*H03F 1/02* (2006.01)
*H03F 3/193* (2006.01)

(52) U.S. Cl.
CPC .............. *H03F 1/223* (2013.01); *H03F 1/0205* (2013.01); *H03F 3/193* (2013.01); *H03F 2200/294* (2013.01); *H03F 2200/411* (2013.01)

(58) Field of Classification Search
CPC ..... H03F 3/193; H03F 3/211; H03F 3/45179; H03F 1/223; H03F 3/245; H03F 2200/294; H03F 3/195; H03F 1/0205; H03F 2203/45631; H03F 3/265; H03F 1/0277; H03F 3/16; H03F 1/22; H03F 3/45188
USPC .................................. 330/311, 301, 277, 117
See application file for complete search history.

(56) References Cited

U.S. PATENT DOCUMENTS

| 4,636,745 | A | * | 1/1987 | Naito ............................. 330/304 |
|---|---|---|---|---|
| 6,107,885 | A | * | 8/2000 | Miguelez et al. ............. 330/276 |
| 6,133,793 | A | * | 10/2000 | Lau et al. ...................... 330/302 |
| 7,035,616 | B2 | * | 4/2006 | Reynolds ....................... 455/326 |
| 7,053,718 | B2 | * | 5/2006 | Dupuis et al. ................. 330/311 |
| 7,193,475 | B2 | * | 3/2007 | Su et al. ........................ 330/301 |
| 7,205,844 | B2 | * | 4/2007 | Su et al. ........................ 330/301 |

OTHER PUBLICATIONS

Yu et al., "A Ka-Band Low Noise Amplifier Using Forward Combining Technique", *IEEE Microwave and Wireless Components Letters*, vol. 20, No. 12, 2010, pp. 672-674. .

* cited by examiner

*Primary Examiner* — Khanh V Nguyen
(74) *Attorney, Agent, or Firm* — Merchant & Gould P.C.

(57) ABSTRACT

An ultra-wideband low-noise amplifier circuit with low power consumption includes a cascode amplifier circuit module and an output combining circuit module. The cascode amplifier circuit module receives an input signal, and outputs a first output signal and a second output signal. The output combining circuit module receives the first output signal and the second output signal, and applies respective phase shifts to the first output signal and the second output signal for reducing a phase difference between the first output signal and the second output signal, so as to obtain a combined output signal.

12 Claims, 5 Drawing Sheets

ULTRA-WIDEBAND LOW-NOISE AMPLIFIER CIRCUIT WITH LOW POWER CONSUMPTION

CROSS-REFERENCE TO RELATED APPLICATION

This application claims priority to Taiwanese Application No. 102129301, filed on Aug. 15, 2013.

BACKGROUND OF THE INVENTION

1. Field of the Invention

The invention relates to an amplifier circuit, and more particularly to an ultra-wideband low-noise amplifier circuit for a radio frequency receiver.

2. Description of the Related Art

Due to development of wireless communication, demands for receiving/transmitting signals and data are growing. In conventional radio frequency receivers, an amplifier is often used as a first-stage component for reducing noise and amplifying signals. How to effectively promote gain of the amplifier and decrease power consumption is a primary goal in the industry.

A cascode amplifier is proposed in "A Ka-Band Low Noise Amplifier Using Forward Combining Technique; Yueh-Hua Yu; Wei-Hong Hsu; Chen, Y.-J. E; Microwave and Wireless Components Letters, IEEE; Volume 20, Issue 12; Digital Object Identidier: 10.1109/LMWC.2010.2085425; Publication Year: 2010; Page(s): 672-674". In the forward combining technique proposed in this reference, precision of the phase shift cannot be achieved merely by a single inductor and a single resistor, leading to insufficient gain of the amplifier.

In addition, some conventional amplifiers use multiple power sources to promote gains thereof, which may lead to increased power consumption.

SUMMARY OF THE INVENTION

Therefore, an object of the present invention is to provide an ultra-wideband low-noise amplifier circuit that may effectively promote gain thereof.

According to the present invention, an ultra-wideband low-noise amplifier circuit with low power consumption comprises:

a cascode amplifier circuit module adapted to receive an input signal, and configured to output a first output signal and a second output signal; and an output combining circuit module coupled to the cascode amplifier circuit module for receiving the first output signal and the second output signal, and configured to apply respective phase shifts to the first output signal and the second output signal for reducing a phase difference between the first output signal and the second output signal, so as to obtain a combined output signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
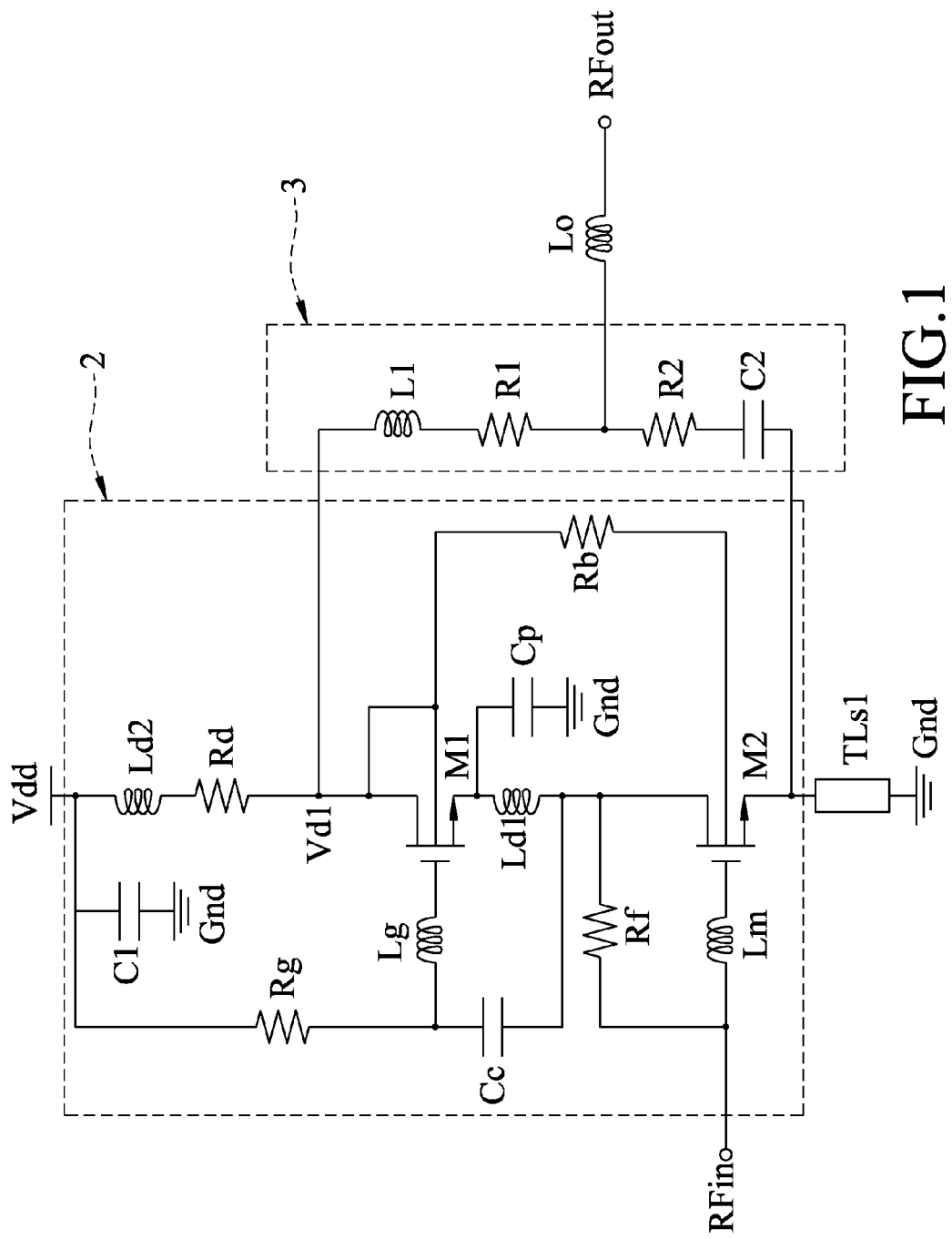
FIG. 1 is a schematic circuit diagram of a preferred embodiment of an ultra-wideband low-noise amplifier circuit according to the present invention.

Referring to FIG. 1, the preferred embodiment of the ultra-wideband (UWB) low-noise amplifier (LNA) circuit with low power consumption according to this invention includes a cascode amplifier circuit module 2, an output combining circuit module 3, a transmission-line matching inductor TLs1, and an output inductor Lo.

The cascode amplifier circuit module 2 is adapted to receive an input signal at an input terminal RFin. In this embodiment, the input signal is a radio-frequency (RF) signal, and is wirelessly received by the cascode amplifier circuit module 2. The cascode amplifier circuit module 2 includes a first transistor M1, a second transistor M2, a first cascode inductor Ld1, a bypass capacitor Cp, a body resistor Rb, a matching inductor Lm, a feedback resistor Rf, a connecting inductor Lg, a coupling capacitor Cc, a first resistor Rg, a capacitor C1, a second cascode inductor Ld2, and a second resistor Rd.

The first transistor M1 and the second transistor M2 are coupled in series between a voltage source Vdd and a ground node Gnd. Each of the first transistor M1 and the second transistor M2 has a first terminal, a second terminal, a control terminal, and a body terminal.

In this embodiment, each of the first transistor M1 and the second transistor M2 is, but is not limited to, an N-type MOSFET that has a drain terminal serving as the first terminal thereof, a source terminal serving as the second terminal thereof, and a gate terminal serving as the control terminal thereof.

The first cascode inductor Ld1 is coupled between the second terminal of the first transistor M1, and the first terminal of the second transistor M2.

The bypass capacitor Cp is coupled between the second terminal of the first transistor M1 and the ground node Gnd.

The body resistor Rb has a first terminal coupled to the first terminal and the body terminal of the first transistor M1 for receiving a self-forward body bias voltage, and a second terminal coupled to the body terminal of the second transistor M2.

The matching inductor Lm has a first terminal receiving the input signal, and a second terminal coupled to the control terminal of the second transistor M2.

The feedback resistor Rf is coupled between the first terminal of the second transistor M2 and the first terminal of the matching inductor Lm.

The connecting inductor Lg and the coupling capacitor Cc are connected in series between the control terminal of the first transistor M1 and the first terminal of the second transistor M2.

The first resistor Rg is coupled between a common node of the connecting inductor Lg and the coupling capacitor Cc, and the voltage source Vdd.

The capacitor C1 is coupled between the voltage source Vdd and the ground node Gnd.

The second cascode inductor Ld2 and the second resistor Rd are coupled in series between the first terminal of the first transistor M1 and the voltage source Vdd.

The output combining circuit module 3 is coupled to the first terminal of the first transistor M1 and the second terminal of the second transistor M2 of the cascode amplifier circuit module 2 for respectively receiving a first output signal and a second output signal therefrom, and is configured to apply respective phase shifts to the first output signal and the second output signal for reducing a phase difference between the first output signal and the second output signal, so as to obtain a combined output signal.

In this embodiment, the output combining circuit module 3 includes a resistor-inductor (RL) circuit and a resistor-capacitor (RC) circuit coupled in series between the first terminal of the first transistor M1 and the second terminal of the second transistor M2. The RL circuit includes an inductor L1 and a resistor R1 coupled in series, and the RC circuit includes a capacitor C2 and a resistor R2 coupled in series. The combined output signal is outputted at a common node of the RL circuit and the RC circuit.

In this embodiment, the RL circuit receives the first output signal, and is configured to apply a positive 90-degree phase shift to the first output signal for generating a first phase-shifted signal component of the combined output signal. The RC circuit receives the second output signal, and is configured to apply a negative 90-degree phase shift to the second output signal for generating a second phase-shifted signal component of the combined output signal. The first and second phase-shifted signal components are superposed to form the combined output signal.

The transmission-line matching inductor TLs1 is coupled between the second terminal of the second transistor M2 and the ground node Gnd for impedance matching with the transmission line.

The output inductor Lo has a first terminal coupled to the common node of the RL circuit and the RC circuit, and a second terminal serving as an output terminal RFout of the UWB LNA circuit.

Figure 2:
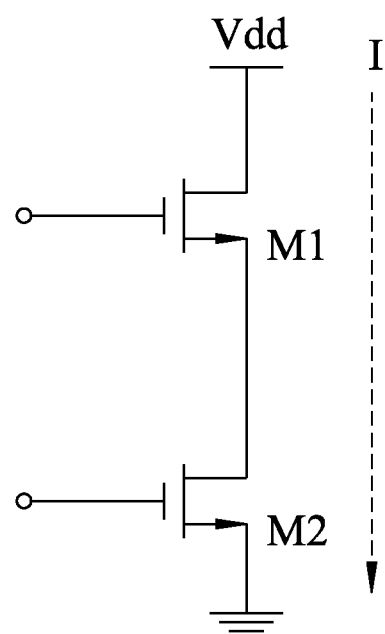
FIG. 2 is a schematic diagram showing a cascode amplifier circuit module of the preferred embodiment under direct-current analysis.

FIG. 2 is a simplified schematic circuit diagram illustrating the cascode amplifier circuit module 2 under direct-current (DC) analysis, where inductor components may serve as short circuits. As shown in FIG. 2, the first transistor M1 and the second transistor M2 are disposed on a same current path (indicated using a broken line I), resulting in current-sharing and reduction of a total current, so as to reduce power consumption.

Figure 3:
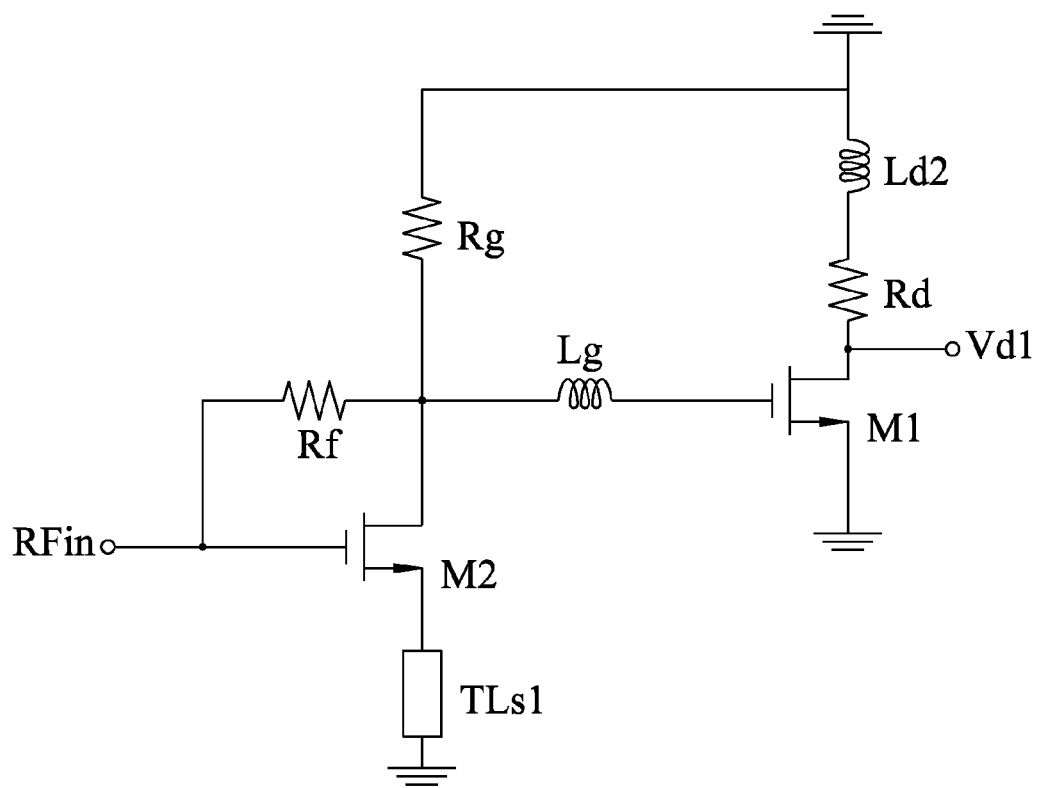
FIG. 3 is a schematic diagram showing the cascode amplifier circuit module of the preferred embodiment under alternating-current analysis.

FIG. 3 is a schematic circuit diagram illustrating the cascode amplifier circuit module 2 under alternating-current (AC) analysis, where capacitor components (e.g., the coupling capacitor Cc and the bypass capacitor Cp) may serve as short-circuits. At resonance, the first cascode inductor Ld1 and parasitic capacitance of the first transistor M1 act like an open circuit, and the matching inductor Lm and parasitic capacitance of the second transistor M2 act like an open circuit, thereby alleviating influences by capacitances in the circuit.

Referring to FIG. 3, the first transistor M1 and the second transistor M2 form a two-stage cascode common source amplifier, increasing voltage gain of a voltage Vd1 at the drain terminal of the first transistor M1 to a voltage at the input terminal RFin, and promoting gain of the output terminal RFout to the input terminal RFin for the UWB LNA circuit.

Figure 4:
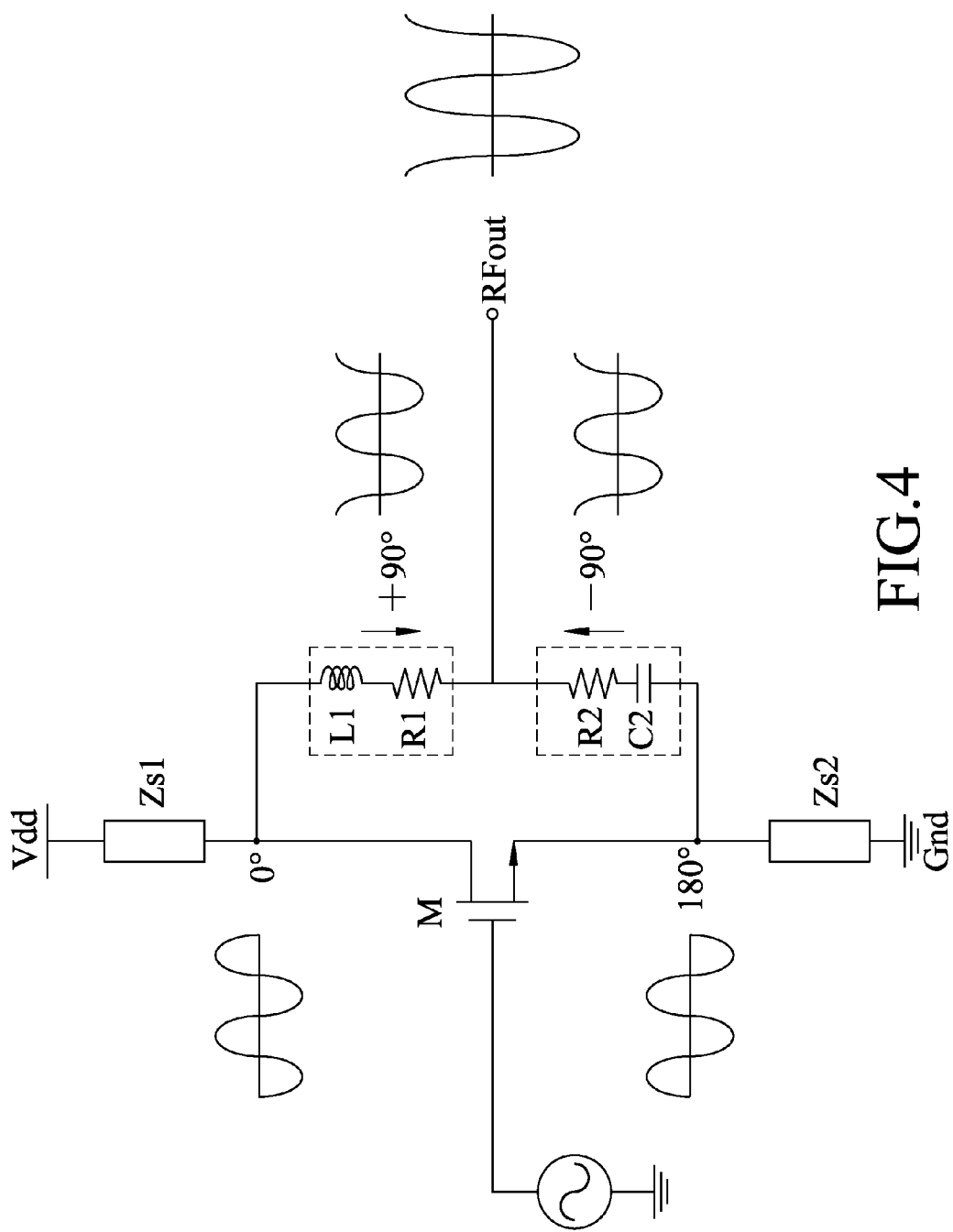
FIG. 4 is a schematic diagram illustrating phase shifting function of an output combining circuit module of the preferred embodiment.

FIG. 4 is a simplified schematic circuit diagram of FIG. 1 for illustrating function of the output combining circuit module 3. The first and second transistors M1, M2 are simplified using a single transistor M, and the circuit impedances are denoted using an impedance symbol Zs1 between the voltage source Vdd and the drain terminal of the transistor M, and an impedance symbol Zs2 between the source terminal of the transistor M and the ground node Gnd.

In general, when a signal is inputted into the transistor M, signals thus provided on the drain and source terminals (i.e., the first and second output signals) have a phase difference of 180 degrees therebetween. Due to the different phases, the two signals cannot be superposed for subsequent applications. Theoretically, inductors are components that apply a positive phase shift of 90 degrees, and capacitors are components that apply a negative phase shift of 90 degrees. In practice, as encountered in the prior art, required precision of phase shift may not be achieved by merely using a single inductor and a single resistor. Therefore, this embodiment uses series-connected resistors (i.e., the resistors R1 and R2) for adjustment, thereby meeting required precision of phase shift. By virtue of the RL circuit and the RC circuit that respectively apply the positive phase shift of 90 degrees and the negative phase shift of 90 degrees to the first and second output signals, the first phase-shifted signal component and the second phase-shifted signal component have substantially the same phase, so that the combined output signal as well as the signal at the output terminal RFout has an amplitude that is twice that of the first output signal or the second output signal, thereby promoting the gain of the preferred embodiment.

Figure 5:
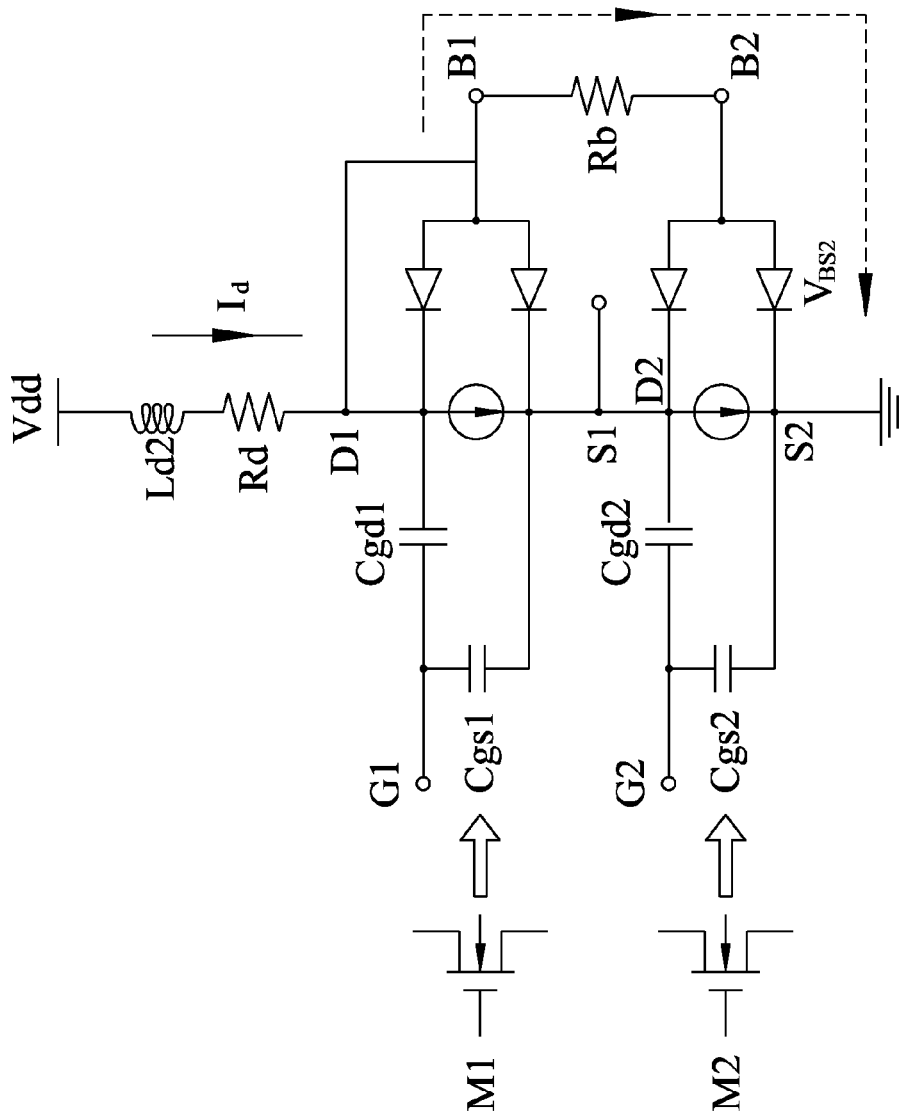
FIG. 5 is a simplified schematic circuit diagram of the cascode amplifier circuit module of the preferred embodiment for illustrating a self-forward body bias in the preferred embodiment.

FIG. 5 shows a simplified schematic circuit diagram of the cascode amplifier circuit module 2 for illustrating the self-forward body bias (SFBB), where the first and second transistors M1, M2 are described using small signal models. The source terminal, the drain terminal, the body terminal, the gate terminal, capacitance between the gate and drain terminals, and capacitance between the gate and source terminals of the first transistor M1 are denoted as S1, D1, B1, G1, Cgd1 and Cgs1, respectively. The source terminal, the drain terminal, the body terminal, the gate terminal, capacitance between the gate and drain terminals, and capacitance between the gate and source terminals of the second transistor M2 are denoted as S2, D2, B2, G2, Cgd2 and Cgs2, respectively. A voltage between the body terminal and the source terminal of the second transistor M2 is denoted as $V_{BS2}$. Resistance of the body resistor Rb is calculated as:

$$Rb = \frac{Vdd - I_d Rd - V_{BS2}}{I_{s2}\left(e^{\frac{V_{BS2}}{\eta V_T}} - 1\right)}$$

where $I_d$ is a current flowing through the second resistor Rd, $I_{s2}$ is a reverse-bias leakage current flowing through a P-N junction of the body terminal and the source terminal of the second transistor M2, $\eta$ is an ideality factor, and $V_T$ is a thermal voltage. By use of the above equation, resistance of the body resistor Rb may be selected for adjusting voltage across the P-N junction of the body terminal and the source terminal of the second transistor M2 (i.e., $V_{BS2}$) so as to obtain a self-forward bias loop with low power consumption, thereby reducing the threshold voltage and the required voltages for driving the first and second transistors M1, M2 (gate-source voltage, Vgs), and achieving low power consumption for this embodiment.

This embodiment has the following advantages:

1. The output combining circuit module 3 employs the resistors R1, R2 to promote precision of phase adjustment, thereby promoting the amplitude of the output signal and the gain of the UWB LNA circuit.

2. By virtue of the body resistor Rb coupled between the body terminals of the first and second transistors M1, M2, and connection thereof to the drain terminal of the first transistor M1, self-forward body bias is formed to result in a lower threshold voltage, thereby reducing required voltages for driving the first and second transistors M1, M2, and reducing power consumption.

3. Compared to some conventional circuits that employ multiple power sources for gain promotion, the preferred embodiment requires only one power source (i.e., the voltage source Vdd) for the whole circuit while maintaining the gain thereof, thereby reducing power consumption without compromising circuit performance.

4. By use of the first cascode inductor Ld1 and the coupling capacitor Cc, current sharing of the first and second transistors M1, M2 is achieved under DC analysis. In AC analysis, the first and second transistors M1, M2 form a two-stage cascode common-source amplifier to promote amplifier gain.

5. By use of inductive peaking technique, the matching inductor Lm with proper inductance is coupled to the control terminal of the second transistor M2, so that the matching inductor Lm and parasitic capacitance of the second transistor M2 act like an open circuit at resonance, preventing reduction of the bandwidth attributable to the parasitic capacitance when the circuit operates at a high frequency and noise from mismatch of input/output impedances to 50 ohm (transmission-line impedance). The input impedance may further match characteristic impedance at the input terminal RFin when connecting the matching inductor Lm to the control terminal of the second transistor M2, thereby achieving wideband impedance matching, wideband noise optimization, and bandwidth extension.

6. By coupling the feedback resistor Rf between the first terminal of the second transistor M2 and the input terminal RFin, a feedback loop is formed, thereby promoting bandwidth and reducing noise.

To sum up, the preferred embodiment may achieve promotion of amplitude of the output signal, reduction of power consumption, promotion of gain, extension of bandwidth, and reduction of noise.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An ultra-wideband low-noise amplifier circuit with low power consumption, comprising:
a cascode amplifier circuit module adapted to receive an input signal, and configured to output a first output signal and a second output signal; and
an output combining circuit module coupled to said cascode amplifier circuit module for receiving the first output signal and the second output signal, and configured to apply respective phase shifts to the first output signal and the second output signal for reducing a phase difference between the first output signal and the second output signal, so as to obtain a combined output signal;
wherein said cascode amplifier circuit module includes a first transistor and a second transistor that are adapted to be coupled in series between a voltage source and a ground node, each of said first transistor and said second transistor having a first terminal, a second terminal, and a control terminal, the first output signal being outputted at said first terminal of said first transistor, the second output signal being outputted at said second terminal of said second transistor; and
wherein each of said first transistor and said second transistor further has a body terminal, and said cascode amplifier circuit module further includes:
a body resistor having a first terminal disposed to receive a self-forward body bias voltage, and a second terminal coupled to said body terminal of said second transistor; and
a matching inductor having a first terminal disposed to receive the input signal, and a second terminal coupled to said control terminal of said second transistor.

2. The ultra-wideband low-noise amplifier circuit as claimed in claim 1, wherein said first terminal of said body resistor is coupled to said first terminal of said first transistor and said body terminal of said first transistor.

3. The ultra-wideband low-noise amplifier circuit as claimed in claim 1, wherein said cascode amplifier circuit module further includes a feedback resistor coupled between said first terminal of said second transistor and said first terminal of said matching inductor.

4. The ultra-wideband low-noise amplifier circuit as claimed in claim 1, wherein said cascode amplifier circuit module further includes:
a first cascode inductor coupled between said second terminal of said first transistor, and said first terminal of said second transistor.

5. The ultra-wideband low-noise amplifier circuit as claimed in claim 4, wherein said cascode amplifier circuit module further includes a bypass capacitor disposed to couple said second terminal of said first transistor to the ground node.

6. The ultra-wideband low-noise amplifier circuit as claimed in claim 1, wherein said output combining circuit module includes:
a resistor-inductor (RL) circuit including an inductor and a resistor that are coupled in series; and
a resistor-capacitor (RC) circuit including a capacitor and a resistor that are coupled in series;
wherein said RL circuit and said RC circuit are coupled together in series between said first terminal of said first transistor and said second terminal of said second transistor; and
wherein the combined output signal is outputted at a common node of said RL circuit and said RC circuit.

7. The ultra-wideband low-noise amplifier circuit as claimed in claim 6, wherein:
said RL circuit is configured to apply a positive 90-degree phase shift to one of the first output signal and the second output signal; and
said RC circuit is configured to apply a negative 90-degree phase shift to the other one of the first output signal and the second output signal.

8. The ultra-wideband low-noise amplifier circuit as claimed in claim 6, wherein said RL circuit is coupled between said first terminal of said first transistor and said common node, and said RC circuit is coupled between said second terminal of said second transistor and said common node.

9. The ultra-wideband low-noise amplifier circuit as claimed in claim 6, further comprising:
- a transmission-line matching inductor disposed to couple said second terminal of said second transistor to the ground node; and
- an output inductor having a first terminal coupled to said common node of said RL circuit and said RC circuit, and a second terminal serving as an output terminal of said ultra-wideband low-noise amplifier circuit.

10. The ultra-wideband low-noise amplifier circuit as claimed in claim 1, wherein said cascode amplifier circuit module further includes a connecting inductor coupled between said control terminal of said first transistor and said first terminal of said second transistor.

11. The ultra-wideband low-noise amplifier circuit as claimed in claim 10, wherein said cascode amplifier circuit module further includes a coupling capacitor coupled to said connecting inductor in series between said control terminal of said first transistor and said first terminal of said second transistor.

12. The ultra-wideband low-noise amplifier circuit as claimed in claim 10, wherein said cascode amplifier circuit module further includes:
- a first resistor disposed to couple said connecting inductor to the voltage source;
- a cascode inductor and a second resistor that are coupled in series and that are disposed to couple said first terminal of said first transistor to the voltage source; and
- a capacitor to be coupled between the voltage source and the ground node.

* * * * *